US011552633B1

(12) United States Patent
Cignoli

(10) Patent No.: US 11,552,633 B1
(45) Date of Patent: Jan. 10, 2023

(54) DRIVER CIRCUIT WITH ENHANCED CONTROL FOR CURRENT AND VOLTAGE SLEW RATES

(71) Applicant: STMicroelectronics S.r.l., Agrate Brianza (IT)

(72) Inventor: Marco Cignoli, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/502,200

(22) Filed: Oct. 15, 2021

(51) Int. Cl.
*H03K 17/00* (2006.01)
*H03K 17/22* (2006.01)
*H03K 19/003* (2006.01)
*H03K 17/687* (2006.01)

(52) U.S. Cl.
CPC ......... *H03K 17/223* (2013.01); *H03K 17/687* (2013.01); *H03K 19/00361* (2013.01); *H03K 2217/0063* (2013.01); *H03K 2217/0072* (2013.01)

(58) Field of Classification Search
None
See application file for complete search history.

(56) References Cited

U.S. PATENT DOCUMENTS

| | | | | |
|---|---|---|---|---|
| 10,090,751 | B1* | 10/2018 | Tsyrganovich | H03K 17/687 |
| 2009/0273957 | A1* | 11/2009 | Feldtkeller | H02M 3/1563 363/98 |
| 2020/0310475 | A1* | 10/2020 | Wang | G05F 1/46 |
| 2021/0159774 | A1* | 5/2021 | Guillot | H03K 19/20 |
| 2022/0103061 | A1* | 3/2022 | Aoki | H03K 17/165 |

* cited by examiner

*Primary Examiner* — Tuan T Lam
(74) *Attorney, Agent, or Firm* — Slater Matsil, LLP

(57) ABSTRACT

An integrated circuit (IC) includes: an input terminal; an output terminal; a first reference voltage terminal and a second reference voltage terminal; a high-side power switch coupled between the first reference voltage terminal and the output terminal; a low-side power switch coupled between the output terminal and the second reference voltage terminal; a first combinational logic and a second combination logic that are coupled to the input terminal; a first driver coupled between the first combinational logic and the high-side power switch; a second driver coupled between the second combinational logic and the low-side power switch; and first comparators coupled to the second combinational logic, where the first comparators are configured to compare a voltage difference between load path terminals of the high-side power switch with a first threshold and a second threshold.

20 Claims, 8 Drawing Sheets

DRIVER CIRCUIT WITH ENHANCED CONTROL FOR CURRENT AND VOLTAGE SLEW RATES

TECHNICAL FIELD

The present invention relates generally to electronic circuits, and, in particular embodiments, to a driver circuit for driving a resistor-inductor (RL) load.

BACKGROUND

Driver circuits are electrical circuits used to control another circuit or component, such as a power transistor, a light emitting diode (LED), or numerous other types of electrical components. Driver circuits are usually used to regulate current flowing through a circuit or are used to control other factors for other components or devices connected to the driver circuit.

In some instances, driver circuits supply power switches to provide an actuation current for an actuator, such as a solenoid. For example, automotive systems, such as vehicle transmissions, vehicle breaking systems, fuel injection systems, and combustion engine valve controls generally include solenoids that are actuated to control those systems. For example, in a fuel injection system, a driver circuit actuates solenoids to initiate fuel injections based on driver input and engine operation. Based on the control signals from the driver circuit, the fuel injectors release fuel into the cylinders of the combustion engine.

SUMMARY

In an embodiment, a circuit for driving a resistor-inductor (RL) load includes: a high-side power switch; a low-side power switch coupled in series with the high-side power switch; a high-side driver, wherein an output terminal of the high-side driver is coupled to a control terminal of the high-side power switch; a low-side driver, wherein an output terminal of the low-side driver is coupled to a control terminal of the low-side power switch; a first combinational logic coupled between an input terminal of the high-side driver and an input terminal of the circuit, wherein the first combinational logic is configured to control operation of the high-side power switch; a second combinational logic coupled between an input terminal of the low-side driver and the input terminal of the circuit, wherein the second combinational logic is configured to control operation of the low-side power switch; and first comparators configured to compare a first voltage across load path terminals of the high-side power switch with a first threshold and a second threshold, wherein output terminals of the first comparators are coupled to the second combinational logic.

In an embodiment, an integrated circuit (IC) includes: an input terminal; an output terminal; a first reference voltage terminal and a second reference voltage terminal; a high-side power switch coupled between the first reference voltage terminal and the output terminal; a low-side power switch coupled between the output terminal and the second reference voltage terminal; a first combinational logic and a second combination logic that are coupled to the input terminal; a first driver coupled between the first combinational logic and the high-side power switch; a second driver coupled between the second combinational logic and the low-side power switch; and first comparators coupled to the second combinational logic, where the first comparators are configured to compare a voltage difference between load path terminals of the high-side power switch with a first threshold and a second threshold.

In an embodiment, a method of operating a driver circuit for driving a resistor-inductor (RL) load includes: switching a high-side power switch of the driver circuit from an ON state to an OFF state while a low-side power switch of the driver circuit is in the OFF state, wherein a first load path terminal of the high-side power switch is coupled to a power supply, a second load path terminal of the high-side power switch is coupled to the RL load, a first load path terminal of the low-side power switch is coupled to the second load path terminal of the high-side power switch, and a second load path terminal of the low-side power switch is coupled to electrical ground; monitoring a first voltage across the first and the second load path terminals of the high-side power switch and a second voltage at a control terminal of the low-side power switch; sending a first pull-up (PU) current having a first value to the control terminal of the low-side power switch when the first voltage is below a first pre-determined value and the second voltage is below a threshold voltage of the low-side power switch; sending a second PU current having a second value different from the first value to the control terminal of the low-side power switch when the first voltage is below the first pre-determined value and the second voltage is above the threshold voltage of the low-side power switch; sending a third PU current having a third value different from the second value to the control terminal of the low-side power switch when the first voltage is above the first pre-determined value and below a second pre-determined value, and when the second voltage is above the threshold voltage of the low-side power switch and below a full-on voltage of the low-side power switch; and sending a fourth PU current having a fourth value different from the third value to the control terminal of the low-side power switch when the first voltage is above the second pre-determined value and when the second voltage is above the full-on voltage of the low-side power switch.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views, which will generally not be re-described in the interest of brevity. For a more complete understanding of the invention, reference is now made to the following descriptions taken in conjunction with the accompanying drawings, in which:

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely a driver circuit for a resistor-inductor (RL) load.

Figure 1:
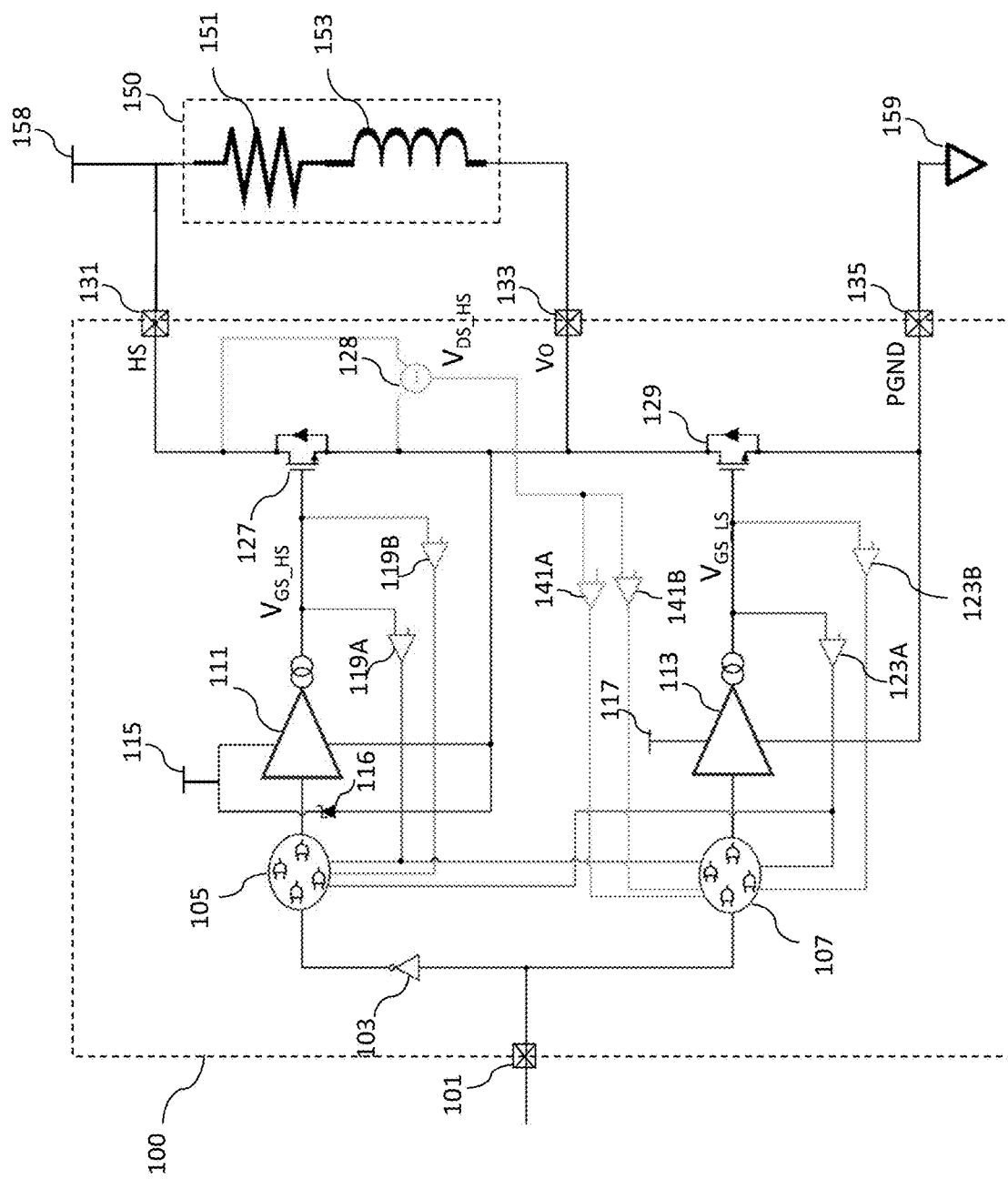
FIG. 1 illustrates a schematic diagram of a driver circuit, in an embodiment.

FIG. 1 illustrates a schematic diagram of a driver circuit 100, in an embodiment. Note that for simplicity, not all features of the driver circuit 100 are illustrated. The driver circuit 100 of FIG. 1 may be used to drive a resistor-inductor (RL) load 150, which may be modeled as a resistor 151 and an inductor 153 coupled in series or in parallel. The RL load 150 may represent a wide range of loads, such as the solenoid valve in an automotive, or the inductor of a DC-DC converter (e.g., buck converter or boost converter). Note that the RL load 150 is not part of the driver circuit 100, but is illustrated to show the electrical connection between the driver circuit 100 and a load of the driver circuit 100. The driver circuit 100 may be formed as an integrated circuit (IC) (or a portion of an IC), such as an application-specific integrated circuit (ASIC) on a substrate (e.g., a silicon substrate) using semiconductor manufacturing processes. The driver circuit 100 may also be formed as a combination of an IC and discrete components in, e.g., electronic control unit (ECU).

As illustrated in FIG. 1, the driver circuit 100 includes an input terminal 101, an output terminal 133, a first reference voltage terminal 131, and a second reference voltage terminal 135. A high-side (HS) power switch 127 is coupled between the first reference voltage terminal 131 (may also be referred to as HS terminal 131 or HS pin 131) and the output terminal 133 (may also be referred to as the Vo terminal 133 or Vo pin 133). A low-side (LS) power switch 129 is coupled between the output terminal 133 and the second reference voltage terminal 135 (may also be referred to as the PGND terminal 135 or PGND pin 135).

The HS power switch 127 and the LS power switch 129 may be any suitable power switches, such as field-effect transistors (FETs) (e.g., metal-oxide-semiconductor field-effect transistors (MOSFETs)), bipolar junction transistor (BJT), insulated-gate bipolar transistor (IGBTs), or the like. The HS power switch 127 and the LS power switch 129 may be collectively referred to as power switches 127 and 129. The discussion herein may refer to the power switches 127 and 129 as MOSFETs, with the understanding that any suitable power switches may be used. In the discussion herein, the power switch 127 (or 129) is said to be turned on (or in the ON state) when a load current flows through the load path terminals (e.g., the source/drain terminals of a MOSFET) of the power switch, and the power switch 127 (or 129) is said to be turned off (or in the OFF state) when no load current flows through the load path terminals. For example, an N-type MOSFET may be turned on by applying a logic high voltage at the control terminal (e.g., the gate terminal) of the N-type MOSET, or injecting a charging current into the control terminal of the N-type MOSFET.

FIG. 1 also illustrates the body diodes of the power switches 127 and 129. One skilled in the art will readily appreciate that the body diode represents a parasitic device of the power switch, and is not a separate, stand-alone, diode connected to the power switch.

Still referring to FIG. 1, a combinational logic 105 is coupled to the input terminal 101 through an inverter 103. The combinational logic 105 may include any suitable types and numbers of logic gates that work together to generate a control signal(s) for controlling the operation of the HS power switch 127 through a driver 111. Similarly, a combinational logic 107 is coupled (e.g., directly coupled) to the input terminal 101. The combinational logic 107 may include any suitable types and numbers of logic gates that work together to generate a control signal(s) for controlling the operation of the LS power switch 129 through a driver 113. Details regarding the functionalities of the combinational logic 105 and the combinational logic 107 are discussed hereinafter. Note that in the discussion herein, unless otherwise specified, the term "coupled" is used to describe electrically coupling between electrical components, either directly (e.g., direct connection through copper lines) or indirectly (e.g., through one or more intervening electrical components). The term "directly coupled" is used to describe direct electrical connection between electrical components through, e.g., conductive lines such as copper line or copper wiring, and therefore, two nodes directly coupled together have substantially the same voltage, in some embodiments.

The drivers in and 113 may be any suitable driver circuits, such as current mirrors, cascade inverters, voltage regulators, combinations thereof, or the like. In the illustrated embodiment, each of the drivers 111 and 113 is a current mirror that drives a respective power switch (e.g., 127 or 129) by supplying a current (e.g., a charging current or a discharging current) to the control terminal (e.g., the gate terminal) of the power switch. The driver 111 is coupled between an output terminal of the combinational logic 105 and the control terminal of the HS power switch 127, and the driver 113 is coupled between an output terminal of the combinational logic 107 and the control terminal of the LS power switch 129. In some embodiments, the output (e.g., an output current) of the combination logic 105 is not strong enough to drive the HS power switch 127, so the driver 111 amplifies the output of the combinational logic 105 to generate a corresponding control signal (e.g., a driving current) large enough to drive the HS power switch 127. Similarly, the driver 113 amplifies the output of the combinational logic 107 to generate a corresponding control signal (e.g., a driving current) large enough to drive the LS power switch 129.

Referring to FIG. 1, the HS terminal 131 is configured to be coupled to a power supply node 158, which is coupled to an external power supply, such as a battery, during operation of the driver circuit 100. A supply voltage $V_{bat}$ of the external power supply (e.g., a battery) may be, e.g., about 14V. The PGND terminal 135 is configured to be coupled to a reference voltage node 159, which is coupled to a reference voltage, such as electrical ground. In FIG. 1, the drivers 111 and 113 are powered by internal power supplies that are coupled to power supply nodes 115 and 117, where the internal power supplies may be, e.g., power converters such as switched mode power supplies (SMPS's), linear regulators, or charge pumps. The supply voltages of the internal power supplies may be any suitable value. In an embodiment, the voltage at the power supply node 115 provided by the internal power supply is ten volts above $V_{bat}$, and the supply voltage at the power supply node 115 is then clamped by a Zener diode 116 to provide a proper bias voltage for the HS power switch 127.

As illustrated in FIG. 1, comparators 123A and 123B (also referred to as voltage comparators) are coupled between the combinational logic 107 and the control terminal of the LS power switch 129. In some embodiments, the comparator 123A is configured to compare the voltage at the control terminal of the LS power switch 129 with a first pre-determined value, which is the threshold voltage $V_{th\_LS}$ of the LS power switch 129; and the comparator 123B is configured to compare the voltage at the control terminal of the LS power switch 129 with a second pre-determined value, which is the full-on voltage $V_{fullon\_LS}$ of the LS power switch 129. Therefore, the output of the comparators 123A and 123B are logic values (e.g., logic low or logic high) indicating whether the voltage at the control terminal of the LS power switch 129 is above the first and second pre-determined values. For embodiments where the LS power switch 129 is a MOSFET, the threshold voltage $V_{th\_LS}$ of the LS power switch 129 may be about 0.7V, and the full-on voltage $V_{fullon\_LS}$ of the LS power switch 129 may be about 2.7V.

One skilled in the art will readily appreciate that during a turn-on phase (also referred to as a charging phase) of the LS power switch 129, when the voltage at the control terminal of the LS power switch 129 (e.g., a gate-source voltage $V_{GS\_LS}$ of the LS power switch 129) rises to the threshold voltage $V_{th\_LS}$, the LS power switch 129 starts to be turned on (e.g., channel region starts to be formed between the source/drain terminals), and current starts to flow between the source/drain terminals of the LS power switch 129 if a voltage is applied between the source/drain terminals. When the voltage at the control terminal of the LS power switch 129 rises to the full-on voltage $V_{fullon\_LS}$, the channel region in the LS power switch 129 is fully formed between the load path terminals (e.g., source/drain terminals). Therefore, by monitoring the voltage (e.g., gate-source voltage $V_{GS\_LS}$) at the control terminal of the LS power switch 129, the status of the LS power switch 129 is monitored in real-time and is sent to the combinational logic 107 for generating the proper control signal at different steps of the turn-on phase, details are discussed below.

Similarly, comparators 119A and 119B are coupled between the combinational logic 105 and the control terminal of the HS power switch 127. In some embodiments, the comparator 119A is configured to compare the voltage (e.g., a gate-source voltage $V_{GS\_HS}$) at the control terminal of the HS power switch 127 with a third pre-determined value, which is the threshold voltage $V_{th\_HS}$ (e.g., 0.7V) of the HS power switch 127; and the comparator 119B is configured to compare the voltage at the control terminal of the HS power switch 127 with a fourth pre-determined value, which is the full-on voltage $V_{fullon\_HS}$ (e.g., 2.7V) of the HS power switch 127. Therefore, by monitoring the voltage (e.g., gate-source voltage $V_{GS\_HS}$) at the control terminal of the HS power switch 127, the status of the HS power switch 127 is monitored in real-time and is sent to the combinational logic 105 for generating the proper control signal at different steps of the turn-on phase, details are discussed below.

Note that the output of the comparator 119A may also be sent to the combinational logic 107, and the output of the comparator 123A may also be sent to the combinational logic 105, because such status information may be used by the combinational logic 105 and the combinational logic 107 to advantageously avoid the occurrence of cross-conduction, which refers to the condition when the HS power switch 127 and the LS power switch 129 are both in the ON state during a same time period. In other words, the combinational logic 105 and the combinational logic 107 may use the output of the comparators (e.g., 119A, 123A) to avoid the cross-conduction condition.

Still referring to FIG. 1, a coupling circuit 128 is coupled to the load path terminals (e.g., source/drain terminals) of the HS power switch 127, and is configured to output a voltage difference VDS HS (e.g., also referred to as a drain-source voltage $V_{DS\_HS}$) between the load path terminals of the HS power switch 127. The voltage difference $V_{DS\_HS}$ is then sent to comparators 141A and 141B (also referred to as voltage comparators). In some embodiments, the comparator 141A compares the drain-source voltage $V_{DS\_HS}$ with a fifth pre-determined value, which is 20% of the supply voltage $V_{bat}$ of the external power supply connected to the power supply node 158; and the comparator 141B compares the drain-source voltage VDS HS with a sixth pre-determined value, which is 80% of the supply voltage $V_{bat}$ of the external power supply. The outputs of the comparators 141A and 141B are used by the combinational logic 107 to generate the control signal for controlling the operation of the driver circuit 100, details are discussed hereinafter.

In some embodiments, the driver circuit 100 is configured to receive a pulse-width modulated (PWM) control signal at the input terminal 101. The combinational logic 105 and the combinational logic 107, based on the PWM control signal and the status of the power switches 127/129, generate control signals (e.g., driving currents) to turn on and off the power switches 127/129 alternately. In the illustrated embodiment, each of the power switch 127 and 129 is turned on and off alternately, and the HS power switch 127 and the LS power switch 129 are turned on during different time intervals to avoid cross-conduction. In particular, the HS power switch 127 is turned on while the LS power switch 129 is turned off; and the HS power switch 127 is turned off while the LS power switch 129 is turned on. In other words, the time intervals during which the HS power switch 127 is turned on are interleaved with the time intervals during which the LS power switch 129 is turned on.

In some embodiments, during operation of the driver circuit 100, when the HS power switch 127 is turned on, the LS power switch 129 is turned off, and an electrical current flows from the power supply node 158, through the RL load 150, into the Vo pin 133, through the load path terminals of the HS power switch 127, and out of the HS pin 131. Next, the HS power switch 127 is turned off, and the LS power switch 129 is turned on, and the electrical current flows from the power supply node 158, through the RL load 150, into the Vo pin 133, through the load path terminals of the LS power switch 129, and out of the PGND pin 135. To avoid cross-conduction, during the transition of the status (e.g., from on to off, or from off to on) of the power switches 127/129, there is a dead time during which both the power switches 127 and 129 are turned off.

Recently, for automotive control systems, the frequency (may also be referred to as PWM actuation frequency) of the PWM control signal for the driver circuit 100 is moving up toward 20 KHz or higher, in order to avoid the audible noises due to actuation of, e.g., solenoid valves in the load. As the PWM actuation frequency increases, the dead time becomes a more significant factor that may limit the performance of systems without the presently disclosed driver circuit. This is because during the dead time, the monitoring circuits and control loops for such systems may not be working, and the current during the dead time is not regulated (e.g., controlled). In addition, the high PWM actuation frequency may cause electro-magnetic emission (EME), which may also be referred to as electromagnetic interference (EMI). For example, the wiring of the driver circuit 100 and/or the wiring of the semiconductor packages comprising the driver circuit 100 may include parasitic inductive effects, which may cause high frequency ringing due to the discontinuous current in the driver circuit 100 during operation.

To shorten the dead time, a simplistic approach may supply a large pull-up current (e.g., a charging current) or a large pull-down current (e.g., a discharging current) to the control terminal of the power switch (e.g., 127 or 129) to turn it on or off quickly. However, without properly regulating the slew rates of the current and/or voltage in the driver circuit, such large current changing at a high frequency may cause significant electromagnetic emission (EME). For an IC designed for the automotive market, the EME of the IC should comply with the IEC 61967-4 standard. For example, one of the requirements described in IEC 61967-4 is related to the allowed radiated and conducted electromagnetic power at each pin of the IC. In addition, IEC 61967-4 provides acceptability masks for conducted/radiated power over a frequency range (e.g., from 150 KHz to 1 GHz) that the IC should comply with. The driver circuit 100 and the method of operating the driver circuit 100, as disclosed herein, allows for precise control of the current slew rate and the voltage slew rate during the on/off transition phase of the power switches. As a result, quick transition and short dead time are achieved while reducing the EME.

Figure 2:
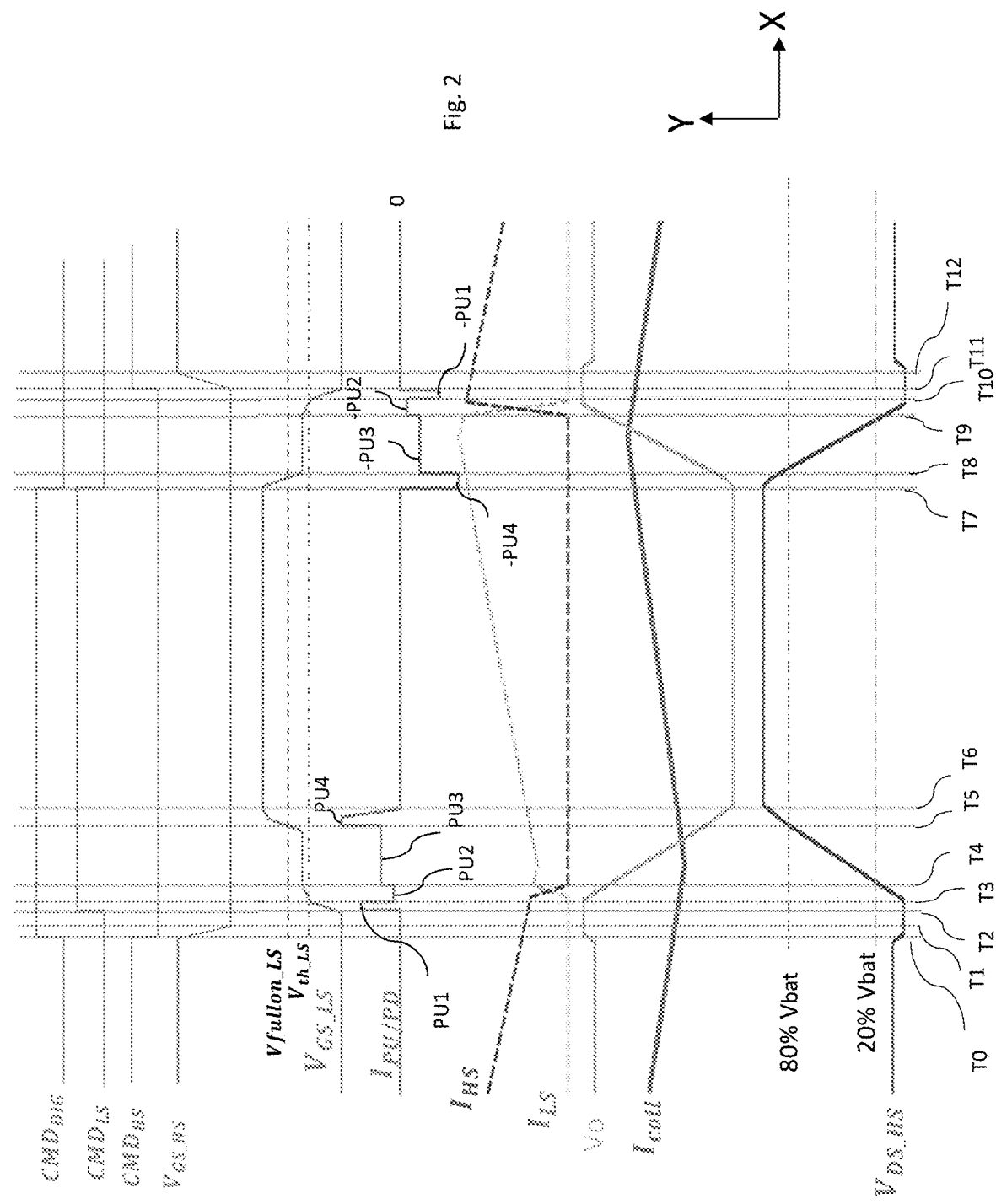
FIG. 2 illustrates a timing diagram for the driver circuit of FIG. 1, in an embodiment.

Operation of the driver circuit 100 of FIG. 1 is discussed below with reference to FIG. 2, which illustrates a timing diagram for the driver circuit 100 of FIG. 1, in an embodiment. The X-axis of FIG. 2 illustrates time, and the Y-axis of FIG. 2 illustrates the amplitudes (e.g., values) of different waveforms. The waveform labeled as $CMD_{DIG}$ represents the PWM control signal $CMD_{DIG}$ at the input terminal 101 of the driver circuit 100. The waveforms labeled as $CMD_{HS}$ and $CMD_{LS}$ represent the output signal $CMD_{HS}$ of the combinational logic 105 and the output signal $CMD_{LS}$ of the combination logic 107, respectively. The waveforms labeled as $V_{GS\_HS}$ and $V_{GS\_LS}$ represent the gate-source voltage $V_{GS\_HS}$ of the HS power switch 127 and the gate-source voltage $V_{GS\_LS}$ of the LS power switch 129, respectively. The waveform labeled as $I_{PU/PD}$ represents the pull-up (PU)/pull-down (PD) current $I_{PU/PD}$ for the LS power switch 129, where a positive value for the PU/PD current $I_{PU/PD}$ means that a current is injected (e.g., charged) into the control terminal of the LS power switch 129 to pull up (e.g., increase) its gate-source voltage, and a negative value for the PU/PD current $I_{PU/PD}$ means that a current flows out of (e.g., discharged from) the control terminal of the LS power switch 129 to pull down (e.g., decrease) its gate-source voltage. The waveforms labeled as $I_{HS}$, $I_{LS}$, and $I_{coil}$ represent the current flowing through the load path terminals of the HS power switch 127, through the load path terminals of the LS power switch 129, and through the RL load 150, respectively. The waveforms labeled as Vo and $V_{DS\_HS}$ represent the voltage at the Vo pin 133 and the voltage across the load path terminals (e.g., drain-source voltage) of the HS power switch 127, respectively.

The discussion of FIG. 2 herein focuses on operation during the turn-on phase (also referred to as a charging phase) of the LS power switch 129, where the LS power switch 129 changes from the OFF state to the ON state after the HS power switch 127 changes from the ON state to the OFF state. In the illustrated embodiment, the turn-on phase of the LS power switch 129 is divided into four sequential steps, and the PU/PD current $I_{PU/PD}$ in each of the four steps is adjusted differently to achieve a target current slew rate or a target voltage slew rate, details are discussed below. In the example of FIG. 2, the power switches 127 and 129 are N-type MOSFETs. One of ordinary skill, upon reading the disclosure herein, should be able to readily apply the principle disclosed herein to driver circuits having other types of power switches. For ease of discussion, the PU/PD current $I_{PU/PD}$ is also referred to as a pull-up current during the turn-on phase of the LS power switch 129.

Referring now to FIG. 2, at time T0, the PWM control signal $CMD_{DIG}$ rises from low to high. In response, the output signal $CMD_{HS}$ of the combinational logic 105 changes from high to low at time T0, which causes the driver 111 to start turning off the HS power switch 127. As a result, the gate-source voltage $V_{GD\_HD}$ of the HS power switch 127 starts to decrease at time T0.

At time T1, the gate-source voltage $V_{GS\_HS}$ of the HS power switch 127 drops below its threshold voltage, and the HS power switch 127 is completely turned off. To ensure that no cross-conduction occurs, the output signal $CMD_{LS}$ of the combinational logic 107 rises from low to high at time T2, which is a short delay (e.g. a propagation time of the combinational logic) after the time T1. The rising edge of the output signal $CMD_{LS}$ at the time T2 causes the driver 13 to start charging the LS power switch 129 with a pull-up current PU1. The LS power switch 129 now enters the first step of the turn-on phase, which first step is defined by the following conditions: $0 < V_{GS\_LS} \leq V_{th\_LS}$ and $0 < V_{DS\_HS} \leq 0.2 V_{bat}$, where $V_{th\_LS}$ is the threshold voltage of the LS power switch 129, $V_{DS\_HS}$ is the voltage across the load path terminals of the HS power switch 127, and $V_{bat}$ is the supply voltage of the power supply connected to the power supply node 158.

Recall that in the discussion of FIG. 1, the voltage $V_{DS\_HS}$ (e.g., the drain-source voltage) of the HS power switch 127 is compared with $0.2 V_{bat}$ and $0.8 V_{bat}$ by the comparators 141A and 141B, and the output of the comparators 141A and 141B are sent to the combinational logic 107. Similarly, the comparators 123A and 123B compare the voltage at the control terminal of the LS power switch 129, which is the voltage $V_{GS\_LS}$ (e.g., the gate-source voltage) of the LS power switch 129 in the illustrated embodiment, with the threshold voltage $V_{th\_LS}$ and the full-on voltage $V_{fullon\_LS}$ of the LS power switch 129, and sends the outputs to the combinational logic 107. Therefore, the combinational logic 107 monitors the status of the HS power switch 127 and the LS power switch 129 in real-time, and determines which step of the turn-on phase the LS power switch 129 should be in, based on the status of the HS power switch 127 and the LS power switch 129. Depending on the step of the turn-on phase, the combination logic 107 generates a respective output signal $CMD_{LS}$ for the driver 113, such that an appropriate current (e.g., a charging current or a discharging current with a certain value) is generated by the driver 113 to drive the LS power switch 129. In the illustrated embodiment, the output signal $CMD_{LS}$ is a bus of digital signals which indicate multiple signal values. The multiple signal values are used by the driver 113 to generate different levels of pull-up/pull-down currents to drive the LS power switch 129 in different steps of the turn-on phase. Note that for simplicity, FIG. 2 plots the $CMD_{LS}$ signal as a binary level signal, with the understanding that when $CMD_{LS}$ is active (e.g., rises from low to high), a multi-level signal, which indicates the value of the driving current, is sent to the driver 113. Details are discussed below.

As illustrated in FIG. 2, in the first step of the turn-on phase, in response to the rising edge of the output signal $CMD_{LS}$ at the time T2, the driver 113 injects a large pull-up current PU1 (e.g., between about 10 mA and about 50 mA) into the control terminal (e.g., gate) of the LS power switch 129, and as a result, the gate-source voltage $V_{GS\_LS}$ of the LS power switch 129 starts to rise at time T2. The large pull-up current PU1 is designed to reduce the dead time and ensure that the channel region of the LS power switch 129 can be quickly formed. In other words, the large pull-up current PU1 is designed to raise the voltage $V_{GS\_LS}$ of the LS power switch 129 quickly past the threshold voltage $V_{th\_LS}$. As an example, the transition time (e.g., time period between the time T0 and time T6, where the time T6 is when the gate-source voltage of the LS power switch 129 reaches the maximum voltage for the ON state) of the LS power switch 129 may be between about 4 µs and about 5 µs, the first step of the turn-on phase is less than 1 µs, such as about 200 ns.

At time T3, the gate-source voltage $V_{GS\_LS}$ of the LS power switch 129 reaches its threshold voltage $V_{th\_LS}$, the LS power switch 129 starts to turn on, and the voltage $V_{DS\_HS}$ is still below $0.2V_{bat}$. The combinational logic 107 then decides that the LS power switch 129 should enter the second step of the turn-on phase, which is defined by the following conditions: $V_{GS\_LS} > V_{th\_LS}$ and $0 < V_{DS\_HS} \leq 0.2V_{bat}$. Therefore, the first step of the turn-on phase, which corresponds to the time period between the time T2 and the time T3, is now finished, and the LS power switch 129 enters the second step of the turn-on phase at the time T3.

As illustrated in FIG. 2, in the second step of the turn-on phase, a different pull-up current PU2 is injected into the control terminal of the LS power switch 129. In the illustrated example, the pull-up current is smaller than the pull-up current PU1. For example, while the pull-up current PU1 may be between about 10 mA and about 50 mA, the pull-up current PU2 may be less than about 1 mA. The smaller value for the pull-up current PU2 may help to reduce the EME during the transition period. The current $I_{LS}$ flowing through the load path terminals (e.g., the source/drain terminals) of the LS power switch 129 starts to increase, and the voltage $V_{GS\_LS}$ of the LS power switch 129 continues to increase toward the Miller Plateau zone, but at a lower voltage slew rate (e.g., slope) than the first step. At the same time, the voltage Vo at the Vo pin 133 starts to be pulled down toward electrical ground, and the voltage $V_{DS\_HS}$ starts to increase from approximately zero voltage toward the power supply voltage $V_{bat}$.

In some embodiments, the pull-up current PU2 is determined by a target current slew rate for the current $I_{LS}$ (e.g., the drain-source current) of the LS power switch 129. The target current slew rate for the current $I_{LS}$ may in turn be determined by an EME mask defined in, e.g., the IEC 61967-4 standard or the particular application the driver circuit 100 is used for. In other words, the slew rate (e.g., slope) of the current $I_{LS}$ during the second step may be adjusted to help achieving EME compliance with, e.g., the IEC 61967-4 standard or a specific design specification.

Figure 3:
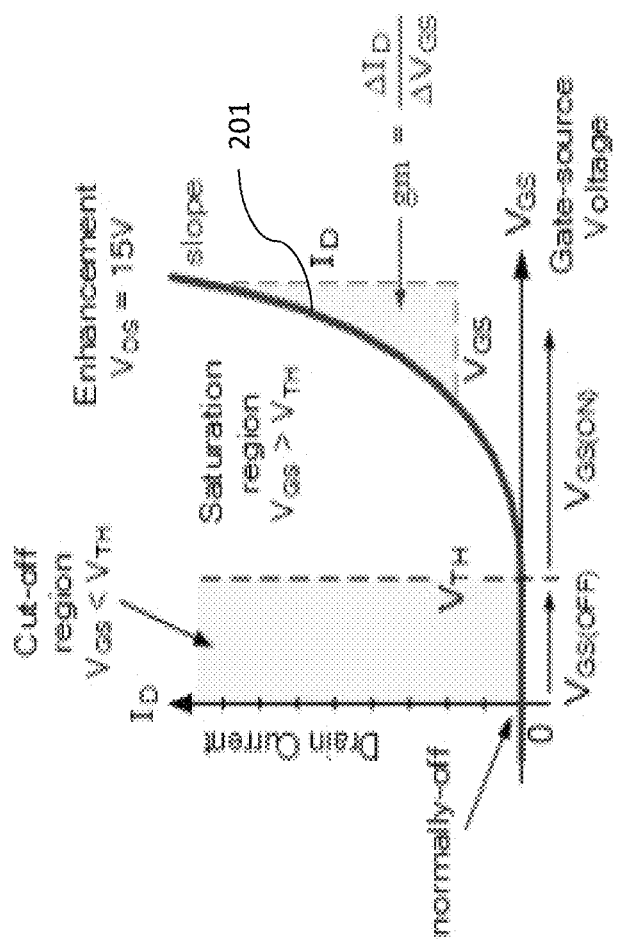
FIG. 3 illustrates the current-voltage (IV) characteristics of a power switch, in an embodiment.

Referring temporarily to FIG. 3, which illustrates the current-voltage (I-V) characteristics of the LS power switch 129. In particular, the curve 201 illustrates the relationship between the gate-source voltage (labeled as $V_{GS}$ in FIG. 3) of the LS power switch 129 and the drain-source current (labeled as ID in FIG. 3) of the LS power switch 129. As illustrated in FIG. 3, when the gate-source voltage $V_{GS}$ rises above the threshold voltage (labeled as $V_{TH}$ in FIG. 3) of the LS power switch 129, the LS power switch 129 enters the saturation region, and the drain-source current $I_D$ rises with the gate-source voltage $V_{GS}$. The amount of change in the drain-source current $I_D$ for a given range of the gate-source voltage $V_{GS}$ is determined by the curve 201. Therefore, by changing how quickly the gate-source voltage $V_{GS}$ traverses the given range of gate-source voltage, the slew rate of the drain-source current $I_D$ can be adjusted to a target value. Since how quickly the gate-source voltage $V_{GS}$ increases can be changed by adjusting the charging current (e.g., the pull-up current PU2) that flows into the control terminal of the LS power switch 129, the slew rate of the drain-source current $I_D$ can be controlled by adjusting the value of the charging current.

Referring back to FIG. 2, in order to achieve a target slew rate for the current $I_{LS}$ during the second step of the turn-on phase, the value of the pull-up current PU2 is determined by the I-V characteristic of the LS power switch 129, and by how the gate-source voltage of the LS power switch 129 changes with the pull-up current, as describe above with reference to FIG. 3. Therefore, the present disclosure allows the slew rate of the drain-source current $I_{LS}$ of the LS power switch 129 to be precisely controlled to achieve a balance between a short transition time and better EME control. Note that during the second step of the turn-on phase, the slew rate (e.g. slope) of the current $I_{LS}$ and the slew rate of the current $I_{HS}$ (e.g., the drain-source current of the HS power switch 127) have the same magnitude but opposite signs. The current $I_{HS}$ may correspond to electrical current flowing through the body diode of the HS power switch 127 during, e.g., the time period from the time T1 to the time T3.

At the time T4, the voltage $V_{DS\_HS}$ rises above 20% the power supply voltage $V_{bat}$, the Miller Plateau voltage is also reached. The combinational logic 107 then decides that the second step of the turn-on phase is finished, and the LS power switch 129 enters the third step of the turn-on phase, which is defined by the following conditions: $V_{th\_LS} < V_{GS\_LS} \leq V_{fullon\_LS}$ and $0.2V_{bat} < V_{DS\_HS} \leq 0.8V_{bat}$.

In the third step of the turn-on phase, a pull-up current PU3, which may be different from the pull-up currents PU2 and PU1, is injected into the control terminal of the LS power switch 129. During the third step, the voltage Vo continues to be pulled toward electrical ground, and the voltage $V_{DS\_HS}$ continues to increase toward power supply voltage $V_{bat}$.

In some embodiments, the slew rate of the voltage Vo during the third step is controlled to achieve a target slew rate, which may help to reduce EME and achieve compliance with, e.g., the IEC 61967-4 standard. In particular, the voltage slew rate may be determined by $dV_o/dt = I_{PU3}/C_{GD\_LS}$, where $I_{PU3}$ is the value of the pull-up current PU3, and $C_{GD\_LS}$ is the intrinsic capacitance of the LS power switch 129. In other words, by adjusting the value of the pull-up current PU3, the slew rate for the voltage Vo during the third step of the turn-on phase can be precisely controlled. Therefore, besides control of the current slew rate in the second step of the turn-on phase, the present disclosure also allows control of the voltage slew rate in the third step of the turn-on phase. The current slew rate and the voltage slew rate can be adjusted to achieve a balance between shortening the transition time and reducing the EME of the IC containing the driver circuit 100.

At the time T5, the voltage $V_{DS\_HS}$ rises above 80% the power supply voltage $V_{bat}$, and the voltage $V_{GS\_LS}$ rises above the full-on voltage $V_{fullon\_LS}$ of the LS power switch 129. In response, the combinational logic 107 decides that the third step of the turn-on phase is finished, and the LS power switch 129 enters the fourth step of the turn-on phase, which is defined by the following conditions: $V_{fullon\_LS} < V_{GS\_LS}$ and $0.8V_{bat} < V_{DS\_HS}$.

In the fourth step, a pull-up current PU4 is injected into the control terminal of the LS power switch 129 to strongly pull the voltage $V_{GS\_LS}$ up to the final voltage value (e.g., +3V). The pull-up current PU4 is a large current similar to, or larger than, the pull-up current PU1. In the example of FIG. 2, the value of the pull-up current PU1 is larger than that of the pull-up current PU2, the value of the pull-up current PU3 is larger than that of that pull-up current PU2 but smaller than that of the pull-up current PU1, and the value of the pull-up current PU4 is larger than that of the pull-up current PU1. This is, of course, merely a non-limiting example. Other relations between the pull-up currents are possible and are fully intended to be included within the scope of the present disclosure. In the illustrated example, after the voltage $V_{GS\_LS}$ reaches the final voltage value (e.g., +3V), the combinational logic 107 stops the driver 113 from charging the LS power switch 129, the pull-up current drops to zero at time T6, which signals the end of the four step of the turn-on phase, and the transition of the LS power switch 129 is now complete. As an example, the time period for the HS power switch 127 to be turned off (e.g., from time T0 to time T1) may be between about 200 ns and 500 ns. The first step of the turn-on phase (e.g., from time T2 to time T3) may be between about 200 ns and about 500 ns. The second step of the turn-on phase (e.g., from time T3 to time T4) may be between about 1 μs and about 1.5 μs. The third step of the turn-on phase (e.g., from time T4 to time T5) may be between about 1 μs and about 1.5 μs. The fourth step of the turn-on phase (e.g., from time T5 to time T6) may be about 500 ns.

FIG. 2 also illustrates the turn-off phase (e.g., from time T7 to around time T12) of the LS power switch 129, where the LS power switch 129 changes from the ON state to the OFF state. Operation of the driver circuit 100 in the turn-off phase follows the same four steps as described above, but in reverse order. In addition, instead of being charging, the LS power switch 129 is being discharged so that its gate-source voltage decreases in the turn-off phase, as illustrated by the negative values of the pull-down current (e.g., –PU4, –PU3, –PU2, and –PU1). One skilled in the art, upon reading the current disclosure, would be able to readily apply the principle discussed above for the turn-on phase to the turn-off phase. Details are not discussed here.

Figure 4:
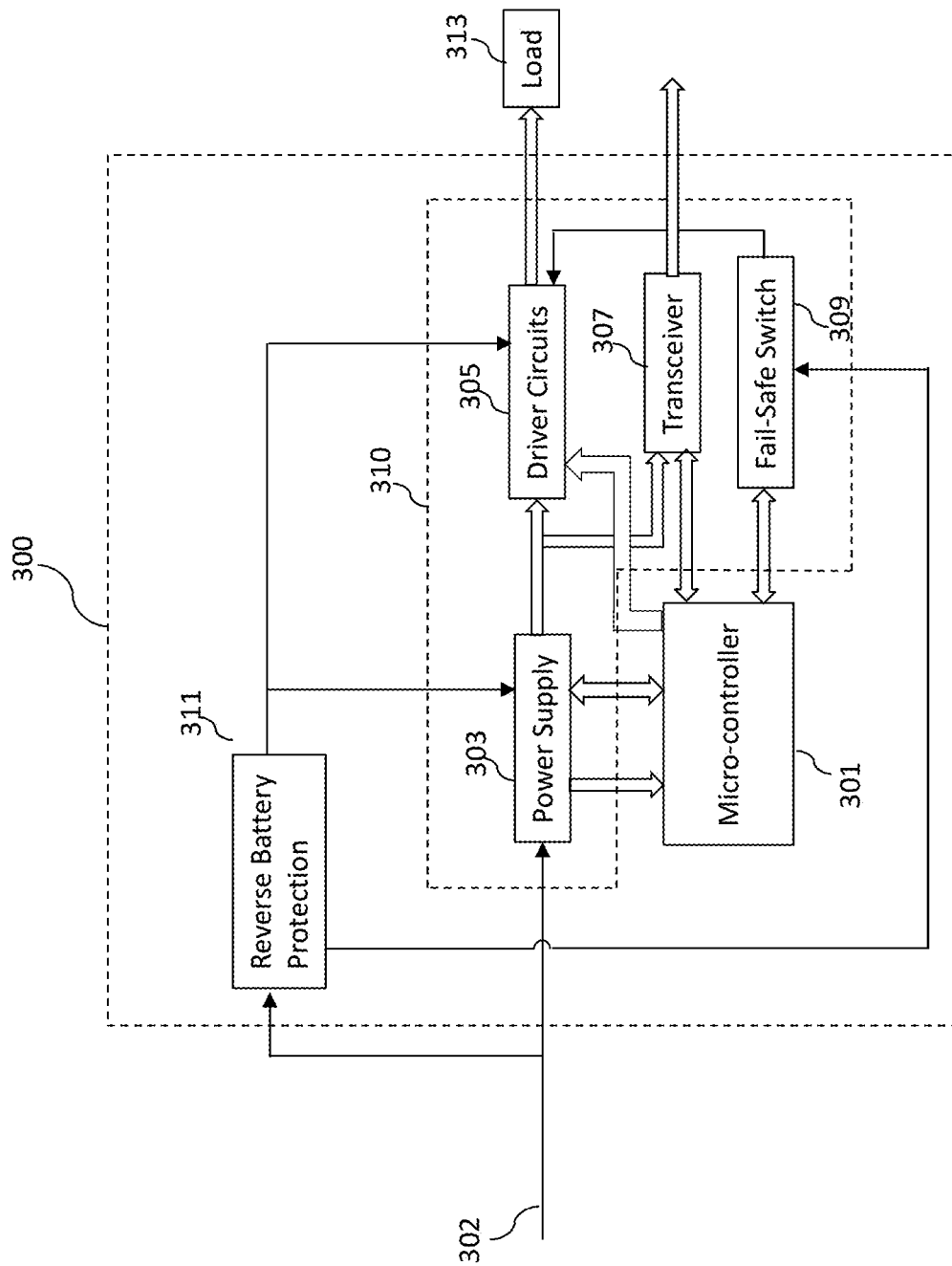
FIG. 4 illustrates a block diagram of a control system, in an embodiment.

FIG. 4 illustrates a block diagram of a control system 300, in an embodiment. The control system 300 may be used for, e.g., an engine control system, a transmission control system, a braking control system, or a steering control system of an automotive. For simplicity, not all functional blocks of the control system 300 are illustrated.

As illustrated in FIG. 4, the control system 300 includes a micro-controller 301 and an integrated circuit (IC) 310. In some embodiments, the micro-controller 301 includes memories (e.g., non-volatile memories) that store computer programs, which when executed by the micro-controller 301, implements various control functions of the control system 300. For example, the micro-controller 301 may generate various control signals (e.g., the PWM control signal that controls the driver circuit 100) to control the functional blocks within the IC 310.

The IC 310 may be an ASIC for automotive control applications. In the example of FIG. 4, the IC 310 includes a plurality of functional blocks, such as a power supply 303 (e.g., a switched-mode power supply) for generating the internal supply voltages used by other blocks within the IC 310. The IC 310 also includes a driver circuit 305, which may be or include the driver circuit 100 of FIG. 1. The driver circuit 305 represents the actuation portion of the IC 310, and may have solenoid drivers, general purpose drivers, LED drivers, combinations thereof, or the like. In addition, the IC 310 also includes a transceiver 307 which is used for, e.g., diagnostic purposes and for communicating with, e.g., other systems in the automotive. Furthermore, the IC 310 includes a fail-safe switch 309 which is used to bias the load 313 (e.g., a solenoid) with a safety path to quickly disconnect the power supply (e.g., battery) in case of critical faults inside the IC 310. The various functional blocks within the IC 310 are interconnected by signal paths between them.

FIG. 4 further illustrates a reverse battery protection block 311 of the control system 300, which as the name suggests, provides reverse battery protection. FIG. 4 shows a load 313, which may be an RL load, coupled to the driver circuit 305. The load 313 is illustrated to show the coupling between the IC 310 and the load 313. The load 313 may not be part of the control system 300. In some embodiments, components of the control system 300, such as the micro-controller 301, the IC 310, and the reverse battery protection block 311, are placed on (e.g., soldered on) a printed circuit board (PCB) to form the control system 300.

Figure 5A:
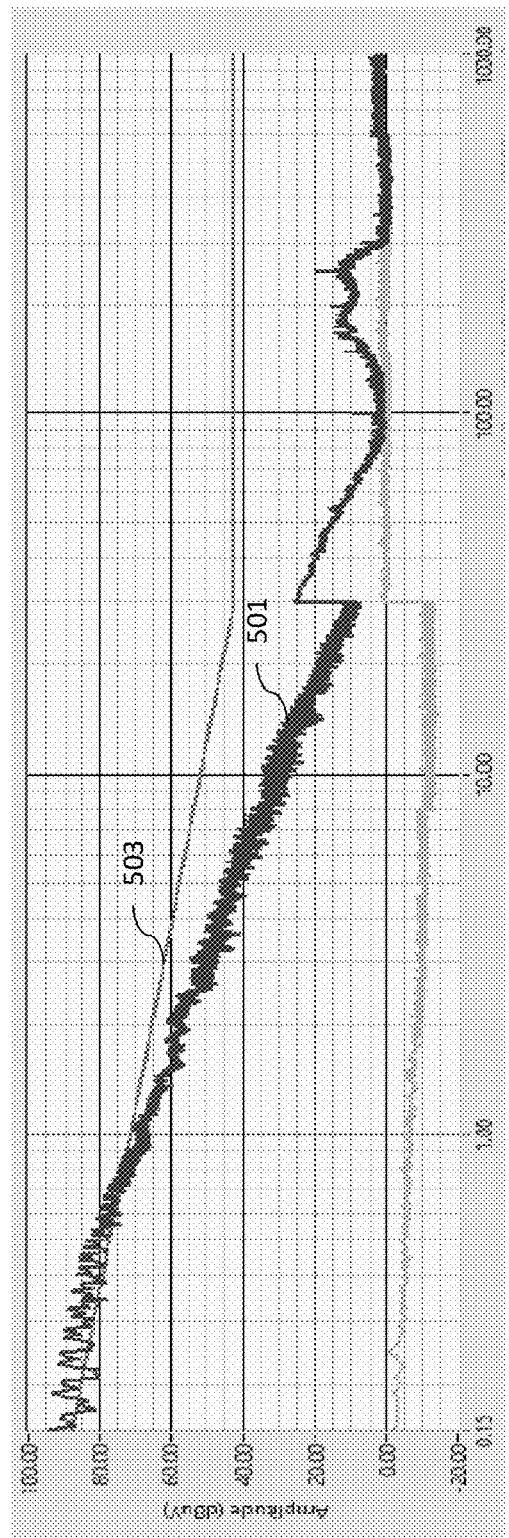
FIGS. 5A and 5B illustrate the performance of the driver circuit of FIG. 1 and a reference driver circuit, respectively, in an embodiment.

FIG. 5A illustrates performance of the driver circuit 100 of FIG. 1, in an embodiment. The curve 501 in FIG. 5A is generated using measured voltage data at the Vo pin 133 of the driver circuit 100. The voltage data was collected when the driver circuit 100 is driven by a PWM control signal having a 14 KHz frequency, and with a current slew rate of 1 A/μs and a voltage slew rate of 15 V/μs for the second step and the third step of the turn-on phase, respectively. A frequency analysis of the voltage data from the Vo pin 133 is done by performing a Fast-Fourier Transform (FFT) of the voltage data. The X-axis of FIG. 5A illustrates frequencies in MHz, and the Y-axis of FIG. 5A illustrates the amplitude of the frequency component of the voltage data. FIG. 5A further illustrates an EME mask curve 503. In the example of FIG. 5A, the EME of the driver circuit 100 at high frequencies (e.g., higher than 1 MHz) are of interest to the particular application. It is seen that by adjusting the current slew rate and the voltage slew rate, the EME is below the EME mask curve 503 at high frequencies.

Figure 5B:
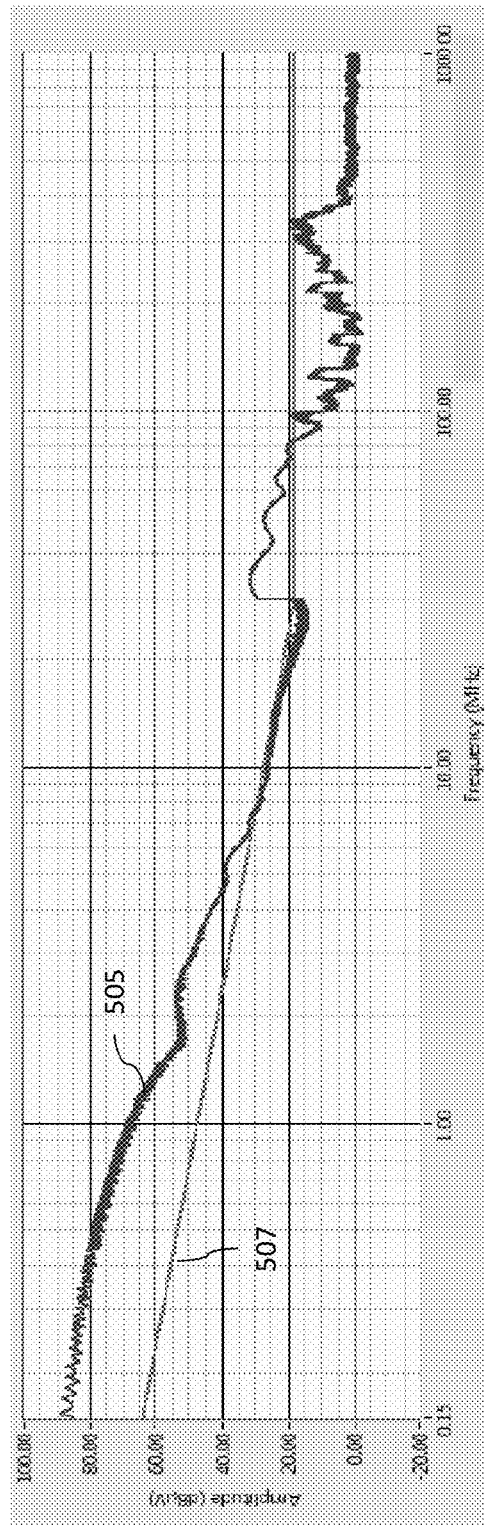

For comparison purpose, the curve 505 in FIG. 5B illustrates the performance of a reference driver circuit, which does not control the turn-on phase with the four steps as described above. Instead, the reference driver circuit of FIG. 5B controls the turn-on phase using three steps by monitoring only the gate-source voltage $V_{GS\_LS}$ of the LS power switch 129, where in the first step, the gate-source voltage of the LS power switch 129 rises from zero to the threshold voltage (0.7 V); in the second step, the gate-source voltage of the LS power switch 129 rises from the threshold voltage to the full-on voltage (e.g., 2.7 V) of the LS power switch 120; and in the third step, the gate-source voltage of the LS power switch 129 rises from the full-on voltage to the final voltage value (e.g., 3 V). In the example of FIG. 5B, the curve 505 are generated using voltage data from the Vo pin 133, using to a PWM control signal having a 5 KHz frequency and using a current slew rate of 4.5 A/μs and a voltage slew rate of 13.5 V/μs for the first step and the second step of the three-step turn-on phase of the reference driver circuit.

Comparing FIGS. 5A and 5B, it is seen that in both figures, the frequency components below about 12 MHz have about the same amplitude. For frequency higher than about 12 MHz, the four-step turn-on phase (see curve 501) disclosed in the present disclosure achieves lower (thus better) EME control than the reference driver circuit with a three step turn-on phase (see curve 505). FIG. 5B also illustrates another EME mask curve 507. Since the reference driver circuit has less control over the EME, the curve 505 is above the EME mask curve 507 over a wide range of frequencies.

Figure 6:
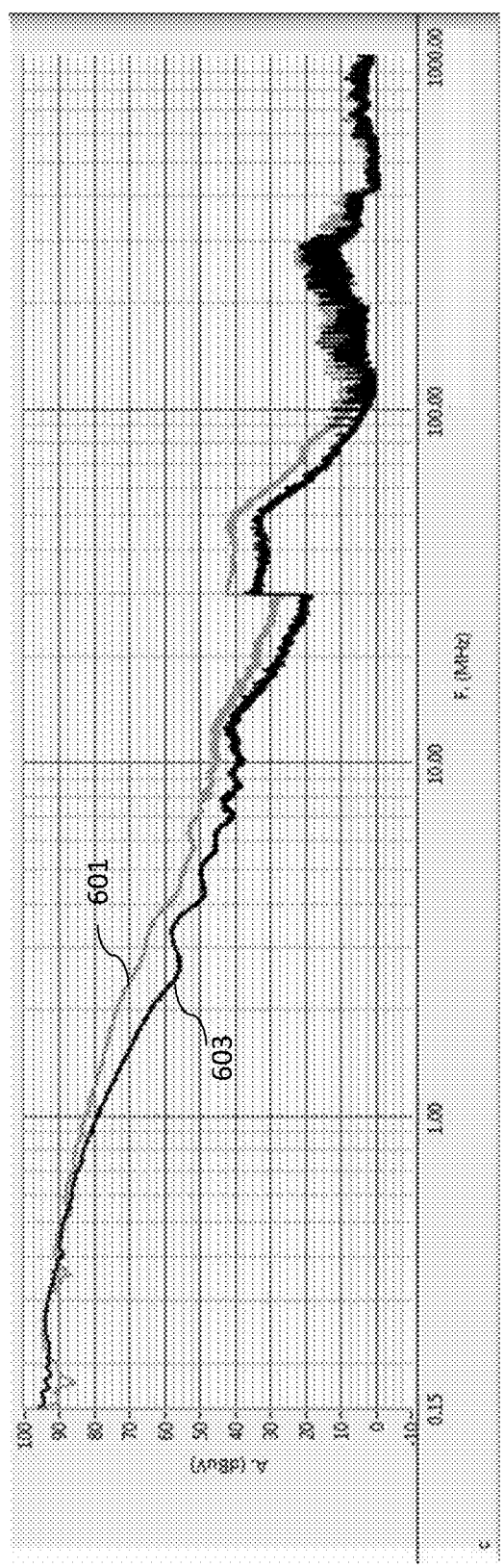
FIG. 6 illustrates the performance of the driver circuit of FIG. 1, in another embodiment.

FIG. 6 illustrates performance of the driver circuit 100 of FIG. 1, in another embodiment. In FIG. 6, the curve 601 corresponds to a PWM control frequency of 16 KHz, with a current slew rate of 4.5 A/μs and a voltage slew rate of 55 V/μs for the second step and the third step of the turn-on phase, respectively. The curve 603 corresponds to a PWM control frequency of 16 KHz, with a current slew rate of 4.5 A/μs and a voltage slew rate of 27 V/μs for the second step and the third step of the turn-on phase, respectively. Comparing the curves 601 and 603 in FIG. 6, it is seen that by reducing the voltage slew rate from 55 V/μs to 27 V/μs in the third step of the turn-on phase, improvements (e.g., reductions in the amplitude of the frequency component) of 5 dB, 8 dB, and 8 dB are achieved at 1 MHz, 10 MHz, and 30 MHz, respectively. This illustrates the advantage of the ability to control the voltage slew rate.

A comparison between the curve 501 in FIG. 5A and the curve 601 in FIG. 6 can provide some insight into the benefit of adjusting the current slew rate during the second step of the turn-on phase. From the results of FIG. 6 discussed above, it is seen that by reducing the voltage slew rate by half (e.g., from 55 V/μs to 27 V/μs), there is an 8 dB improvement in the EME at 10 MHz and 30 MHz. Assuming that halving the voltage slew rate results an 8 dB improvement, and noting that the voltage slew rate (e.g., 13.5 V/μs) for curve 501 is half of the voltage slew rate (e.g., 27 V/μs) for the curve 601, one would expect another 8 dB improvement from curve 601 to curve 501 at 10 MHz and 30 MHz. The curve 501 shows actual improvements of 19 dB from curve 601 to curve 501 at 10 MHz and 30 MHz. Therefore, the additional improvement of 3 dB (e.g., 19−2×8=3) is achieved, which may be attributed to the better control of the current slew rate (e.g., from 4.5 A/μs in curve 601 to 1 A/μs in curve 501) during the second step of the turn-on phase.

Figure 7A:
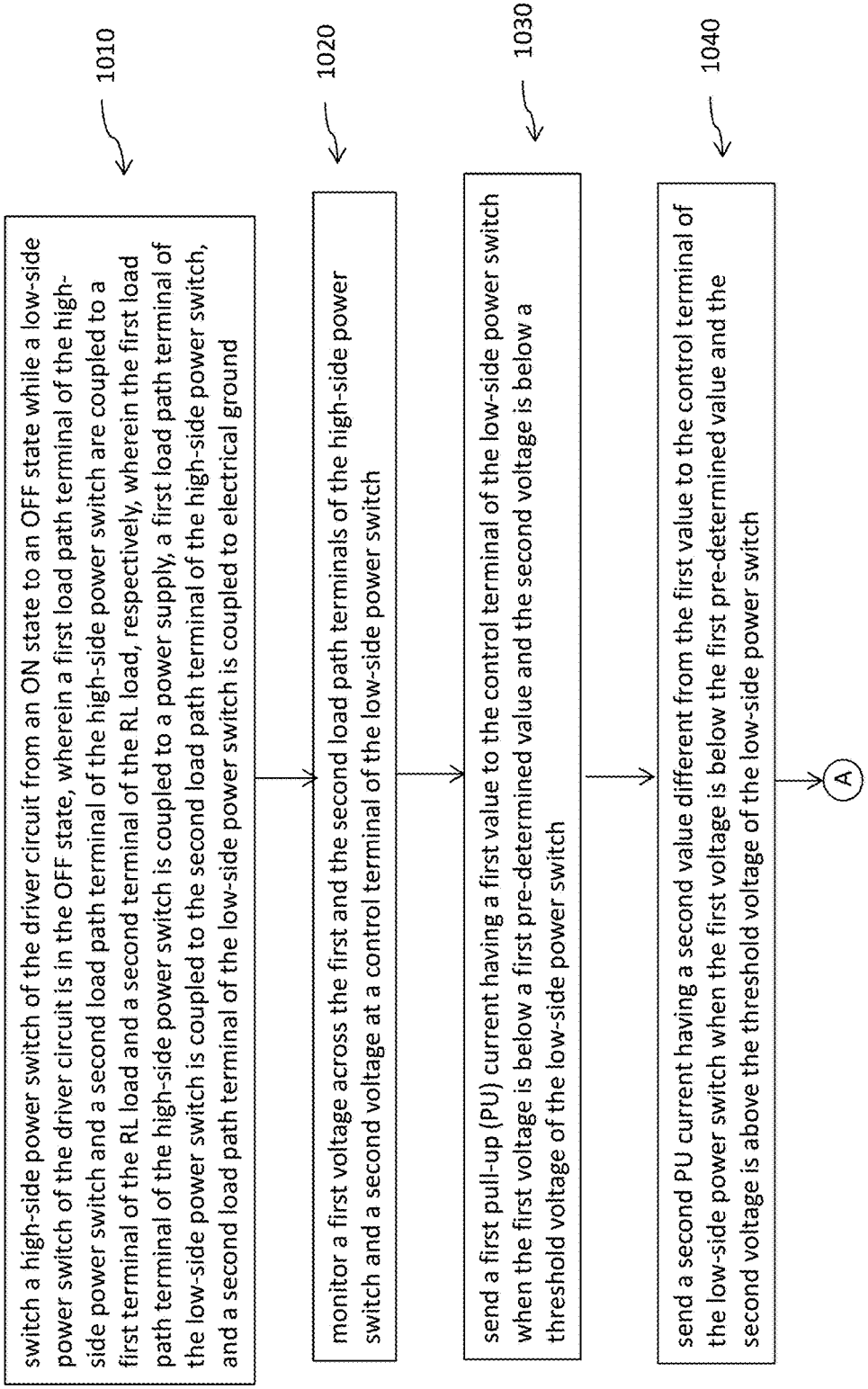
FIGS. 7A and 7B together illustrate a flow chart of a method for operating a driver circuit for driving a resistor-inductor (RL) load, in some embodiments.
Figure 7B:
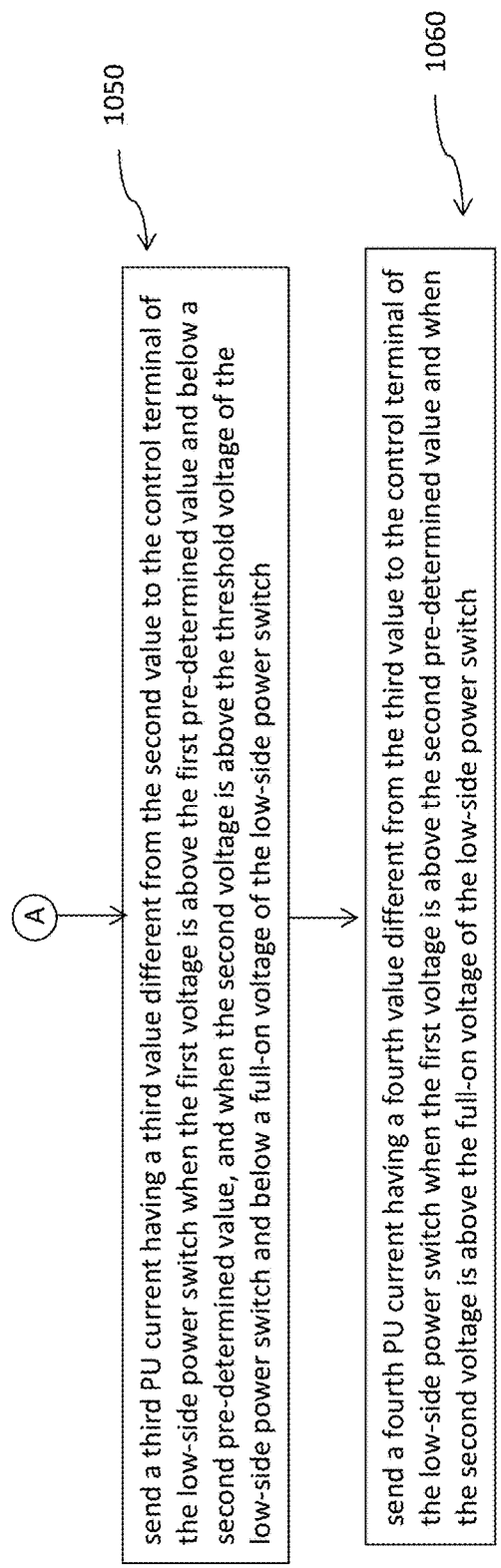

FIGS. 7A and 7B together illustrate a flow chart of a method 1000 for operating a driver circuit for driving a resistor-inductor (RL) load, in some embodiments. It should be understood that the embodiment method shown in FIGS. 7A and 7B is merely an example of many possible embodiment methods. One of ordinary skill in the art would recognize many variations, alternatives, and modifications. For example, various steps as illustrated in FIGS. 7A and 7B may be added, removed, replaced, rearranged and repeated.

Referring to FIGS. 7A and 7B, at block 1010, a high-side power switch of the driver circuit is switched from an ON state to an OFF state while a low-side power switch of the driver circuit is in the OFF state, wherein a first load path terminal of the high-side power switch and a second load path terminal of the high-side power switch are coupled to a first terminal of the RL load and a second terminal of the RL load, respectively, wherein the first load path terminal of the high-side power switch is coupled to a power supply, a first load path terminal of the low-side power switch is coupled to the second load path terminal of the high-side power switch, and a second load path terminal of the low-side power switch is coupled to electrical ground. At block 1020, a first voltage across the first and the second load path terminals of the high-side power switch and a second voltage at a control terminal of the low-side power switch are monitored. At block 1030, a first pull-up (PU) current having a first value is sent to the control terminal of the low-side power switch when the first voltage is below a first pre-determined value and the second voltage is below a threshold voltage of the low-side power switch. At block 1040, a second PU current having a second value different from the first value is sent to the control terminal of the low-side power switch when the first voltage is below the first pre-determined value and the second voltage is above the threshold voltage of the low-side power switch. At block 1050, a third PU current having a third value different from the second value is sent to the control terminal of the low-side power switch when the first voltage is above the first pre-determined value and below a second pre-determined value, and when the second voltage is above the threshold voltage of the low-side power switch and below a full-on voltage of the low-side power switch. At block 1060 a fourth PU current having a fourth value different from the third value is sent to the control terminal of the low-side power switch when the first voltage is above the second pre-determined value and when the second voltage is above the full-on voltage of the low-side power switch.

Modifications and variations of the present disclosure are possible and are fully intended to be included within the scope of the present disclosure. For example, while the illustrated embodiment is for the so-called LS driver applications where the pull-up/pull-down currents of the LS power switch 129 are controlled during the turn-on/turn-off phase, skilled artisan, upon reading the present disclosure, would be able to readily apply the principle disclosed herein to HS driver applications where the pull-up/pull-down currents of the HS power switch 127 are controlled during the turn-on/turn-off phase, and the RL load 150 are coupled between the Vo terminal 133 and the PGND terminal 135. In particular, for HS driver applications, the gate-source voltage $V_{GS}$ HS of the HS power switch 127 and the drain-source voltage $V_{DS\_LS}$ of the LS power switch 129 are monitored to decide the four steps of the turn-on (or turn-off) phase. In other words, one may replace $V_{GS\_LS}$ and $V_{DS\_HS}$ in the discussion of LS driver application with $V_{GS\_HS}$ and $V_{DS\_LS}$, respectively, to derive the discussion for the HS driver application. As another example, in the illustrated embodiment, to determine the four steps of the turn-on phase (or turn-off phase), the $V_{DS\_HS}$ is compared with two thresholds, e.g., $0.2V_{bat}$ and $0.8V_{bat}$. The thresholds $0.2V_{bat}$ and $0.8V_{bat}$ may be replaced with other suitable values, such as by 30% of $V_{bat}$ ($0.3V_{bat}$) and 70% of $V_{bat}$ ($0.7V_{bat}$), respectively. As yet another example, while FIG. 1 illustrates the RL load 150 (e.g., a solenoid valve) being coupled between the HS terminal 131 and the Vo terminal 133, the RL load 150 may be coupled to the Vo terminal 133 only. In an example embodiment, the RL load 150 is a buck converter, and only the Vo terminal 133 is directly coupled to the buck converter.

Disclosed embodiments may achieve advantages. For example, the disclosed driver circuit 100 has voltage comparators for monitoring the gate-source voltage of the LS power switch 129 and the drain-source voltage of the HS power switch 127. During operation, the gate-source voltage of the LS power switch 129 and the drain-source voltage of the HS power switch 127 are used to determine which of the four steps of the turn-on phase the LS power switch 129 should be in, and different pull-up currents can be applied for each step of the turn-on phase, which allows precise control of the current slew rate and the voltage slew rate during the turn-on phase. As a result, short dead time is achieved during the turn-on phase while reducing the EME.

Example embodiments of the present invention are summarized here. Other embodiments can also be understood from the entirety of the specification and the claims filed herein.

Example 1. In an embodiment, a circuit for driving a resistor-inductor (RL) load includes: a high-side power switch; a low-side power switch coupled in series with the high-side power switch; a high-side driver, wherein an output terminal of the high-side driver is coupled to a control terminal of the high-side power switch; a low-side driver, wherein an output terminal of the low-side driver is coupled to a control terminal of the low-side power switch; a first combinational logic coupled between an input terminal of the high-side driver and an input terminal of the circuit, wherein the first combinational logic is configured to control operation of the high-side power switch; a second combinational logic coupled between an input terminal of the low-side driver and the input terminal of the circuit, wherein the second combinational logic is configured to control operation of the low-side power switch; and first comparators configured to compare a first voltage across load path terminals of the high-side power switch with a first threshold and a second threshold, wherein output terminals of the first comparators are coupled to the second combinational logic.

Example 2. The circuit of Example 1, wherein a first load path terminal of the high-side power switch is coupled to a first reference voltage terminal of the circuit, and a second load path terminal of the high-side power switch is coupled to an output terminal of the circuit, wherein the output terminal of the circuit is configured to be coupled to the RL load.

Example 3. The circuit of Example 2, wherein a first load path terminal of the low-side power switch is coupled to the output terminal of the circuit, and a second load path terminal of the low-side power switch is coupled to a second reference voltage terminal of the circuit.

Example 4. The circuit of Example 3, wherein the first reference voltage terminal of the circuit is configured to be coupled to a power supply, and the second reference voltage terminal of the circuit is configured to be coupled to an electrical ground.

Example 5. The circuit of Example 4, wherein the power supply has a supply voltage, wherein the first threshold and the second threshold are 20% and 80%, respectively, of the supply voltage.

Example 6. The circuit of Example 5, wherein the second combinational logic is configured to, during a turn-on phase of the low-side power switch: monitoring the first voltage across the load path terminals of the high-side power switch and a second voltage at the control terminal of the low-side power switch; and in response to detecting that the first voltage is below the first threshold and the second voltage is below a threshold voltage of the low-side power switch, injecting a first pull-up (PU) current having a first amplitude into the control terminal of the low-side power switch; and in response to detecting that the first voltage is below the first threshold and the second voltage is above the threshold voltage of the low-side power switch, injecting a second PU current having a second amplitude different from the first amplitude into the control terminal of the low-side power switch.

Example 7. The circuit of Example 6, wherein the second amplitude of the second PU current is smaller than the first amplitude of the first PU current.

Example 8. The circuit of Example 6, wherein the second amplitude of the second PU current is determined in accordance with a target current slew rate for a current flowing through the load path terminals of the low-side power switch during the turn-on phase.

Example 9. The circuit of Example 8, wherein the second combinational logic is further configured to, during the turn-on phase of the low-side power switch: in response to detecting that the first voltage is above the first threshold and below the second threshold, and that the second voltage is above the threshold voltage of the low-side power switch and below a full-on voltage of the low-side power switch, injecting a third PU current having a third amplitude different from the second amplitude into the control terminal of the low-side power switch; and in response to detecting that the first voltage is above the second threshold and the second voltage is above the full-on voltage of the low-side power switch, injecting a fourth PU current having a fourth amplitude different from the third amplitude into the control terminal of the low-side power switch.

Example 10. The circuit of Example 9, wherein the third amplitude of the third PU current is determined in accordance with a target voltage slew rate for a voltage at the output terminal of the circuit during the turn-on phase.

Example 11. The circuit of Example 1, further comprising: second comparators coupled between the control terminal of the low-side power switch and the second combinational logic, wherein the second comparators are configured to compare a voltage at the control terminal of the low-side power switch with a threshold voltage of the low-side power switch and a full-on voltage of the low-side power switch.

Example 12. An integrated circuit (IC) includes: an input terminal; an output terminal; a first reference voltage terminal and a second reference voltage terminal; a high-side power switch coupled between the first reference voltage terminal and the output terminal; a low-side power switch coupled between the output terminal and the second reference voltage terminal; a first combinational logic and a second combination logic that are coupled to the input terminal; a first driver coupled between the first combinational logic and the high-side power switch; a second driver coupled between the second combinational logic and the low-side power switch; and first comparators coupled to the second combinational logic, wherein the first comparators are configured to compare a voltage difference between load path terminals of the high-side power switch with a first threshold and a second threshold.

Example 13. The IC of Example 12, further comprising: second comparators coupled between the low-side power switch and the second combinational logic, wherein the second comparators are configured to compare a voltage at a control terminal of the low-side power switch with a threshold voltage of the low-side power switch and a full-on voltage of the low-side power switch.

Example 14. The IC of Example 12, wherein the input terminal of the IC is configured to be coupled to a pulse-width modulation (PWM) signal, wherein the output terminal of the IC is configured to be coupled to a load, wherein the first reference voltage terminal of the IC is configured to be coupled to a power supply external to the IC, and the second reference voltage terminal of the IC is configured to be coupled to a reference voltage node.

Example 15. The IC of Example 12, wherein each of the high-side power switch and the low-side power switch is configured to be turned on and off alternately, wherein the high-side power switch and the low-side power switch are configured to be turned on during first time intervals and second time intervals, respectively, wherein the first time intervals are interleaved with the second time intervals.

Example 16. The IC of Example 12, wherein the second combinational logic is configured to, in a charging-phase of the low-side power switch: monitoring a first voltage across load path terminals of the high-side power switch and a second voltage at a control terminal of the low-side power switch; sending a first pull-up (PU) current having a first amplitude to the control terminal of the low-side power switch when the first voltage is below a first pre-determined value and the second voltage is below a threshold voltage of the low-side power switch; sending a second PU current having a second amplitude different from the first amplitude to the control terminal of the low-side power switch when the first voltage is below the first pre-determined value and the second voltage is above the threshold voltage of the low-side power switch; sending a third PU current having a third amplitude different from the second amplitude to the control terminal of the low-side power switch when the first voltage is above the first pre-determined value and below a second pre-determined value, and when the second voltage is above the threshold voltage of the low-side power switch and below a full-on voltage of the low-side power switch; and sending a fourth PU current having a fourth amplitude different from the third amplitude to the control terminal of the low-side power switch when the first voltage is above the second pre-determined value and when the second voltage is above the full-on voltage of the low-side power switch.

Example 17. In an embodiment, a method of operating a driver circuit for driving a resistor-inductor (RL) load includes: switching a high-side power switch of the driver circuit from an ON state to an OFF state while a low-side power switch of the driver circuit is in the OFF state, wherein a first load path terminal of the high-side power switch is coupled to a power supply, a second load path terminal of the high-side power switch is coupled to the RL load, a first load path terminal of the low-side power switch is coupled to the second load path terminal of the high-side power switch, and a second load path terminal of the low-side power switch is coupled to electrical ground; monitoring a first voltage across the first and the second load path terminals of the high-side power switch and a second voltage at a control terminal of the low-side power switch; sending a first pull-up (PU) current having a first value to the control terminal of the low-side power switch when the first voltage is below a first pre-determined value and the second voltage is below a threshold voltage of the low-side power switch; sending a second PU current having a second value different from the first value to the control terminal of the low-side power switch when the first voltage is below the first pre-determined value and the second voltage is above the threshold voltage of the low-side power switch; sending a third PU current having a third value different from the second value to the control terminal of the low-side power switch when the first voltage is above the first pre-determined value and below a second pre-determined value, and when the second voltage is above the threshold voltage of the low-side power switch and below a full-on voltage of the low-side power switch; and sending a fourth PU current having a fourth value different from the third value to the control terminal of the low-side power switch when the first voltage is above the second pre-determined value and when the second voltage is above the full-on voltage of the low-side power switch.

Example 18. The method of Example 17, wherein the power supply has a supply voltage, wherein the first pre-determined value is 30% of the supply voltage, and the second pre-determined value is 70% of the supply voltage.

Example 19. The method of Example 18, wherein the second value of the second PU current is determined in accordance with a target current slew rate for a current flowing between the first and the second load path terminals of the low-side power switch.

Example 20. The method of Example 19, wherein the third value of the third PU current is determined in accordance with a target voltage slew rate for a voltage at the second load path terminal of the high-side power switch.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit for driving a resistor-inductor (RL) load, the circuit comprising:
   a high-side power switch;
   a low-side power switch coupled in series with the high-side power switch;
   a high-side driver, wherein an output terminal of the high-side driver is coupled to a control terminal of the high-side power switch;
   a low-side driver, wherein an output terminal of the low-side driver is coupled to a control terminal of the low-side power switch;
   a first combinational logic coupled between an input terminal of the high-side driver and an input terminal of the circuit, wherein the first combinational logic is configured to control operation of the high-side power switch;
   a second combinational logic coupled between an input terminal of the low-side driver and the input terminal of the circuit, wherein the second combinational logic is configured to control operation of the low-side power switch;
   first comparators configured to compare a first voltage across load path terminals of the high-side power switch with a first threshold and a second threshold, wherein output terminals of the first comparators are coupled to the second combinational logic; and
   second comparators coupled between the control terminal of the low-side power switch and the second combinational logic, wherein the second comparators are configured to compare a voltage at the control terminal of the low-side power switch with a threshold voltage of the low-side power switch and a full-on voltage of the low-side power switch.

2. The circuit of claim 1, wherein a first load path terminal of the high-side power switch is coupled to a first reference voltage terminal of the circuit, and a second load path terminal of the high-side power switch is coupled to an output terminal of the circuit, wherein the output terminal of the circuit is configured to be coupled to the RL load.

3. The circuit of claim 2, wherein a first load path terminal of the low-side power switch is coupled to the output terminal of the circuit, and a second load path terminal of the low-side power switch is coupled to a second reference voltage terminal of the circuit.

4. The circuit of claim 3, wherein the first reference voltage terminal of the circuit is configured to be coupled to a power supply, and the second reference voltage terminal of the circuit is configured to be coupled to an electrical ground.

5. The circuit of claim 4, wherein the power supply has a supply voltage, wherein the first threshold and the second threshold are 20% and 80%, respectively, of the supply voltage.

6. The circuit of claim 5, wherein the second combinational logic is configured to, during a turn-on phase of the low-side power switch:

monitoring the first voltage across the load path terminals of the high-side power switch and a second voltage at the control terminal of the low-side power switch; and in response to detecting that the first voltage is below the first threshold and the second voltage is below a threshold voltage of the low-side power switch, injecting a first pull-up (PU) current having a first amplitude into the control terminal of the low-side power switch; and in response to detecting that the first voltage is below the first threshold and the second voltage is above the threshold voltage of the low-side power switch, injecting a second PU current having a second amplitude different from the first amplitude into the control terminal of the low-side power switch.

7. The circuit of claim 6, wherein the second amplitude of the second PU current is smaller than the first amplitude of the first PU current.

8. The circuit of claim 6, wherein the second amplitude of the second PU current is determined in accordance with a target current slew rate for a current flowing through the load path terminals of the low-side power switch during the turn-on phase.

9. The circuit of claim 8, wherein the second combinational logic is further configured to, during the turn-on phase of the low-side power switch:

in response to detecting that the first voltage is above the first threshold and below the second threshold, and that the second voltage is above the threshold voltage of the low-side power switch and below a full-on voltage of the low-side power switch, injecting a third PU current having a third amplitude different from the second amplitude into the control terminal of the low-side power switch; and in response to detecting that the first voltage is above the second threshold and the second voltage is above the full-on voltage of the low-side power switch, injecting a fourth PU current having a fourth amplitude different from the third amplitude into the control terminal of the low-side power switch.

10. The circuit of claim 9, wherein the third amplitude of the third PU current is determined in accordance with a target voltage slew rate for a voltage at the output terminal of the circuit during the turn-on phase.

11. The circuit of claim 1, wherein the input terminal of the circuit is configured to be coupled to a pulse-width modulation (PWM) signal.

12. The circuit of claim 4, wherein the power supply has a supply voltage, wherein the first threshold and the second threshold are 30% and 70%, respectively, of the supply voltage.

13. An integrated circuit (IC) comprising:

an input terminal;

an output terminal;

a first reference voltage terminal and a second reference voltage terminal;

a high-side power switch coupled between the first reference voltage terminal and the output terminal;

a low-side power switch coupled between the output terminal and the second reference voltage terminal;

a first combinational logic and a second combination logic that are coupled to the input terminal;

a first driver coupled between the first combinational logic and the high-side power switch;

a second driver coupled between the second combinational logic and the low-side power switch;

first comparators coupled to the second combinational logic, wherein the first comparators are configured to compare a voltage difference between load path terminals of the high-side power switch with a first threshold and a second threshold; and second comparators coupled between the low-side power switch and the second combinational logic, wherein the second comparators are configured to compare a voltage at a control terminal of the low-side power switch with a threshold voltage of the low-side power switch and a full-on voltage of the low-side power switch.

14. The IC of claim 13, wherein the input terminal of the IC is configured to be coupled to a pulse-width modulation (PWM) signal, wherein the output terminal of the IC is configured to be coupled to a load, wherein the first reference voltage terminal of the IC is configured to be coupled to a power supply external to the IC, and the second reference voltage terminal of the IC is configured to be coupled to a reference voltage node.

15. The IC of claim 13, wherein each of the high-side power switch and the low-side power switch is configured to be turned on and off alternately, wherein the high-side power switch and the low-side power switch are configured to be turned on during first time intervals and second time intervals, respectively, wherein the first time intervals are interleaved with the second time intervals.

16. The IC of claim 13, wherein the second combinational logic is configured to, in a charging-phase of the low-side power switch:

monitoring a first voltage across load path terminals of the high-side power switch and a second voltage at a control terminal of the low-side power switch;

sending a first pull-up (PU) current having a first amplitude to the control terminal of the low-side power switch when the first voltage is below a first pre-determined value and the second voltage is below a threshold voltage of the low-side power switch;

sending a second PU current having a second amplitude different from the first amplitude to the control terminal of the low-side power switch when the first voltage is below the first pre-determined value and the second voltage is above the threshold voltage of the low-side power switch;

sending a third PU current having a third amplitude different from the second amplitude to the control terminal of the low-side power switch when the first voltage is above the first pre-determined value and below a second pre-determined value, and when the second voltage is above the threshold voltage of the low-side power switch and below a full-on voltage of the low-side power switch; and sending a fourth PU current having a fourth amplitude different from the third amplitude to the control terminal of the low-side power switch when the first voltage is above the second pre-determined value and when the second voltage is above the full-on voltage of the low-side power switch.

17. A method of operating a driver circuit for driving a resistor-inductor (RL) load, the method comprising:
- switching a high-side power switch of the driver circuit from an ON state to an OFF state while a low-side power switch of the driver circuit is in the OFF state, wherein a first load path terminal of the high-side power switch is coupled to a power supply, a second load path terminal of the high-side power switch is coupled to the RL load, a first load path terminal of the low-side power switch is coupled to the second load path terminal of the high-side power switch, and a second load path terminal of the low-side power switch is coupled to electrical ground;
- monitoring a first voltage across the first and the second load path terminals of the high-side power switch and a second voltage at a control terminal of the low-side power switch;
- sending a first pull-up (PU) current having a first value to the control terminal of the low-side power switch when the first voltage is below a first pre-determined value and the second voltage is below a threshold voltage of the low-side power switch;
- sending a second PU current having a second value different from the first value to the control terminal of the low-side power switch when the first voltage is below the first pre-determined value and the second voltage is above the threshold voltage of the low-side power switch;
- sending a third PU current having a third value different from the second value to the control terminal of the low-side power switch when the first voltage is above the first pre-determined value and below a second pre-determined value, and when the second voltage is above the threshold voltage of the low-side power switch and below a full-on voltage of the low-side power switch; and
- sending a fourth PU current having a fourth value different from the third value to the control terminal of the low-side power switch when the first voltage is above the second pre-determined value and when the second voltage is above the full-on voltage of the low-side power switch.

18. The method of claim 17, wherein the power supply has a supply voltage, wherein the first pre-determined value is 30% of the supply voltage, and the second pre-determined value is 70% of the supply voltage.

19. The method of claim 18, wherein the second value of the second PU current is determined in accordance with a target current slew rate for a current flowing between the first and the second load path terminals of the low-side power switch.

20. The method of claim 19, wherein the third value of the third PU current is determined in accordance with a target voltage slew rate for a voltage at the second load path terminal of the high-side power switch.

* * * * *